United States Patent
Langston (12) 
(10) Patent No.: US 6,507,247 B2
(45) Date of Patent: Jan. 14, 2003

(54) CIRCUIT AND METHOD FOR GENERATING A VARIABLE FREQUENCY CLOCK SIGNAL

(75) Inventor: Roland V. Langston, Glendale, AZ (US)

(73) Assignee: Corrent Corporation, Tempe, AZ (US)

( * ) Notice: Subject to any disclaimer, the term of this patent is extended or adjusted under 35 U.S.C. 154(b) by 0 days.

(21) Appl. No.: 09/797,126

(22) Filed: Feb. 27, 2001

(65) Prior Publication Data

US 2002/0118071 A1 Aug. 29, 2002

(51) Int. Cl.[7] .................................................. H03B 5/24
(52) U.S. Cl. ............................... 331/47; 331/57; 331/78
(58) Field of Search ............................... 331/47, 57, 78

(56) References Cited

U.S. PATENT DOCUMENTS 4,932,053 A * 6/1990 Fruhauf et al. ................. 380/4
5,404,402 A * 4/1995 Sprunk ........................... 380/4

* cited by examiner

*Primary Examiner*—David C. Mis
(74) *Attorney, Agent, or Firm*—Quarles & Brady Streich Lang; Paul D. Amrozowicz, Esq.

(57) ABSTRACT

A circuit and method for generating a variable frequency clock signal that uses a first, lower frequency oscillator, to modulate and vary the frequency of a second, higher frequency oscillator to generate a variable frequency clock signal. The circuit includes a first oscillator, a control circuit, and a second oscillator. The first oscillator generates a first signal having a substantially fixed-frequency magnitude. The control circuit is coupled to receive the first signal from the first oscillator and outputs control signals based on the received first signal. The second oscillator is coupled to receive the control signals from the control circuit and generates the variable frequency magnitude clock signal in response to the received control signal.

38 Claims, 6 Drawing Sheets

CIRCUIT AND METHOD FOR GENERATING A VARIABLE FREQUENCY CLOCK SIGNAL

BACKGROUND OF THE INVENTION

1. Field of the Invention

The present invention relates to an astable oscillator circuit for generating a variable frequency clock signal. More particularly, the invention relates to an oscillator circuit that uses a first, lower frequency oscillator, to modulate and vary the frequency of a second, higher frequency oscillator to generate a variable frequency clock signal. The invention further relates to a method of generating a variable frequency clock signal.

2. Description of Related Art

Various circuits that are designed to generate random data signals use one or more variable frequency clocks as sources of randomness. One example of a variable frequency clock circuit that is used extensively is an astable phase-lock-loop (PLL) circuit. An astable PLL is designed like a conventional PLL, but does not "lock" onto a particular frequency. Instead, an astable PLL continuously varies in frequency around a central frequency. Astable PLLs are, however, relatively complex and, therefore, increase system costs. Other variable frequency clock circuit designs typically require custom analog circuits to be designed, which also increases system costs.

Hence, there is a need in the art for a variable frequency clock circuit that is simpler than an astable PLL circuit, and that requires no custom analog circuit design.

SUMMARY OF THE INVENTION

The present invention relates to a circuit and method for generating a variable frequency clock signal. In one aspect of the present invention, an astable oscillator circuit for generating a clock signal having a variable frequency magnitude includes a first oscillator, a control circuit, and a second oscillator. The first oscillator generates a first signal having a substantially fixed-frequency magnitude. The control circuit is coupled to receive the first signal from the first oscillator an outputs control signals based on the received first signal. The second oscillator is coupled to receive the control signals from the control circuit and generates the variable frequency magnitude clock signal in response to the received control signal.

In another aspect of the invention, a method of generating a clock signal having a variable frequency magnitude includes the step of generating a first signal having a substantially fixed-frequency magnitude. Then, control signals are generated on the basis of the first signal. The variable frequency magnitude clock signal is then generated in response to the control signals.

In still a further aspect of the present invention, an astable oscillator circuit for generating a clock signal having a variable frequency magnitude includes a fixed-frequency oscillation means, a control means, and a variable frequency oscillation means. The fixed-frequency oscillation means generates a substantially fixed-frequency magnitude signal. The control means is coupled to receive the substantially fixed-frequency magnitude signal and generates control signals based at least in part on the substantially fixed-frequency magnitude signal. The variable frequency oscillation means is responsive to the control signals and generates the variable frequency magnitude clock signal.

The present invention provides several advantages over known circuits and methods for providing variable frequency clock signals. First, the present invention is much simpler than various other known designs, such as the astable PLL design. Second, the present invention can be implemented using components from standard cell libraries, without the need for custom-designed circuitry. Third, by using one oscillator to modulate another oscillator, the unpredictability that is inherent in each oscillator circuit is enhanced. And finally, the unpredictability of the overall frequency variation is further enhanced since, not only is the frequency of one oscillator being forced to shift around, but the variations of each oscillator due to manufacturing process deviations, temperature changes, and supply voltage variations are multiplied together.

BRIEF DESCRIPTION OF THE DRAWINGS

FIG. 8 is a diagram depicting an example of various waveforms associated with the circuit depicted in FIG. 1.

DETAILED DESCRIPTION OF THE INVENTION

Figure 1:
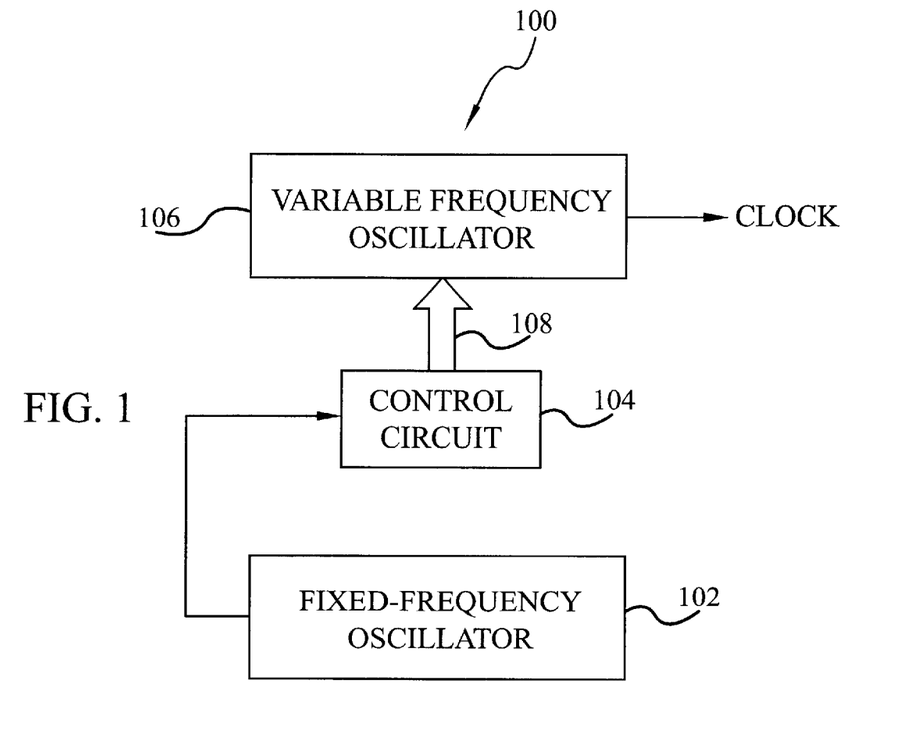
FIG. 1 is a block diagram of a circuit for generating a variable frequency signal according to the present invention.
Figure 2:
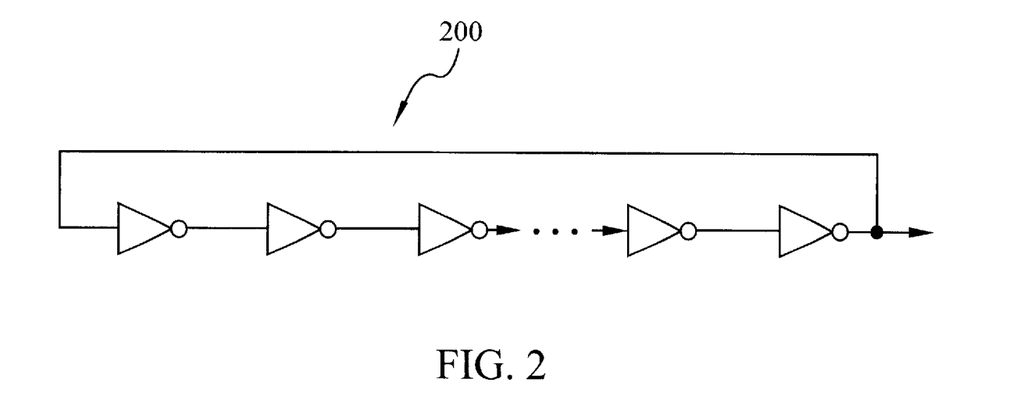
FIG. 2 is a simplified block diagram of a substantially fixed-frequency, free-running ring oscillator used in the circuit depicted in FIG. 1.

A block diagram of one embodiment of a circuit for generating a variable frequency signal is depicted in FIG. 1. As depicted, the circuit 100 includes a first oscillator 102, a control circuit 104, and a second oscillator 106. The first oscillator 102 is a fixed-frequency oscillator. Thus, it generates a signal having a frequency that is substantially constant over time. Any variations in the frequency of the signal generated by the first oscillator 102, assuming it is operating as designed, will be due to environmental changes, such as temperature, or changes in the operating voltage supply (not illustrated) to the oscillator. The first oscillator 102 may be one of numerous oscillator designs known in the art; but, in a preferred embodiment, the first oscillator 102 is a free-running ring oscillator. A non-limiting example of one implementation of a free-running ring oscillator 200 is depicted more explicitly in FIG. 2. It is to be appreciated that the particular ring oscillator depicted therein is one of many ring oscillator designs that can be used to implement the present invention. Moreover, the present invention is not limited to a ring oscillator design, but such is only exemplary of a preferred embodiment.

Returning now to FIG. 1, the control circuit 104 is coupled to receive the substantially fixed-frequency signal from the first oscillator 102. The control circuit 104 is configured to output control signals 108 to the second oscillator 106 that are based, at least partially, on the substantially fixed-frequency signal received from the first oscillator 102. Specifically, the control circuit 104 combines the fixed-frequency signal and a feedback signal (discussed more fully below) to generate the control signals 108. Non-limiting examples of circuits that can be used to implement the control circuit 104 include a linear feedback shift register, and a serial shift register with an inverter in the feedback element. Examples of each of these circuits are depicted in FIG. 3 and FIG. 4, respectively, and briefly discussed herein below.

Figure 3:
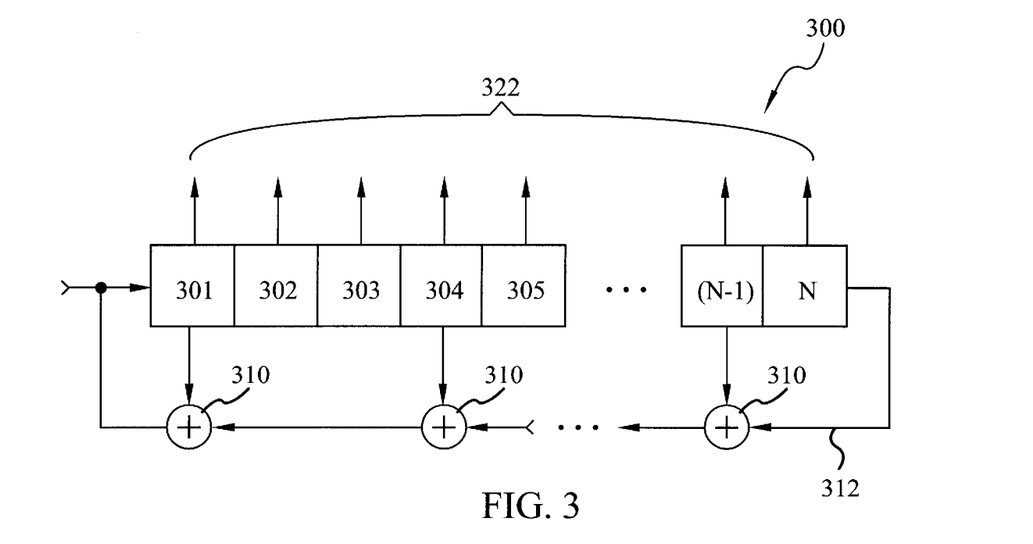
FIG. 3 is a block diagram of one embodiment of a specific implementation of a control circuit used in the circuit depicted in FIG. 1.

With reference to FIG. 3, one example of the numerous linear feedback shift register designs known in the art is illustrated. This particular linear feedback shift register 300, essentially comprises a serial shift register in which bits are input to an input register 301, and serially shifted to the next register 302, 303, 304, . . . N, in synchronism with a non-illustrated system clock. One or more exclusive-OR (XOR) gates 310 are used to XOR selected bits with other XORed bits in a feedback path 312 to the input register 301. Thus, the content of each register 301, 302, 303, . . . N is generated substantially arbitrarily. A plurality of parallel output lines 322, one from each register 301, 302, 303, . . . N, provide the control signals 108 to the second oscillator 106 as a plurality of substantially arbitrary control bits. It will be appreciated that the linear feedback shift register described and depicted is one of many such designs that could be used to realize the control circuit 104 of the present invention.

Figure 4:
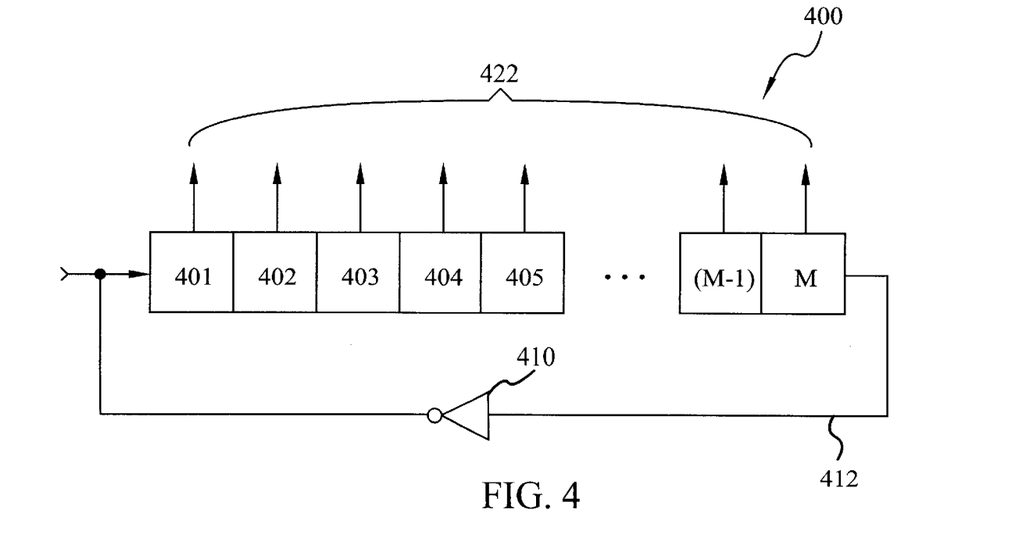
FIG. 4 is a block diagram of another embodiment of a specific implementation of the control circuit used in the circuit depicted in FIG. 1.

Turning now to FIG. 4, an illustrative example of the serial shift register implementation of the control circuit 104 will be discussed. This particular serial shift register 400, like the linear feedback shift register 300, comprises a plurality of registers 401, 402, 403, . . . M. Similarly, bits are input to the input register 401 and are serially shifted to the next register in synchronism with the non-illustrated system clock. With this implementation of the control circuit 104, a feedback path 412 includes only inverter circuit 410. Thus, the register contents are not generated substantially arbitrarily. A plurality of parallel output lines 422, one from each register, provide the control signals 108 to the second oscillator 106 as a plurality of control bits. Again, it will be appreciated that the shift register implementation described and depicted is one of many such designs that could be used to realize the control circuit 104 of the present invention.

Figure 5:
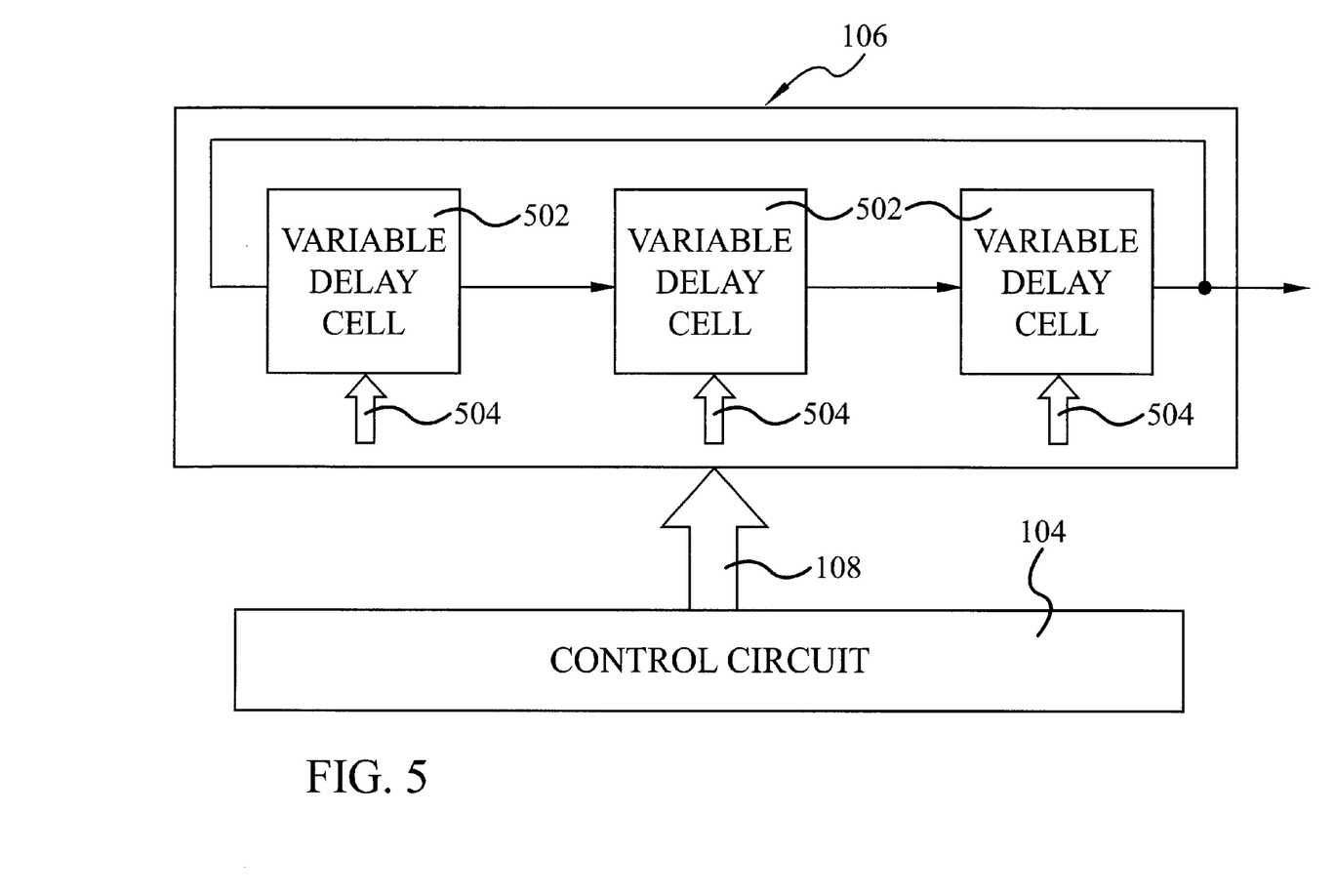
FIG. 5 is a block diagram of a variable frequency oscillator used in the circuit depicted in FIG. 1.

Attention will now be turned to a discussion of the second oscillator 106. In this regard, reference should be made to FIG. 5, which depicts a preferred embodiment of the second oscillator 106. The second oscillator 106 comprises a plurality of variable delay cells 502 that are coupled together in a ring configuration. Although FIG. 5 depicts three delay cells 502, it will be appreciated that any odd number of cells greater than one will provide the needed functionality. As is known in the art, the delay time of a variable delay cell 502 is controlled by a signal(s) on a control input line(s) 504. Thus, the delay time of each variable delay cell 502 is controlled by the control signals 108 received on each individual delay cell control input lines(s) 504.

Figure 6:
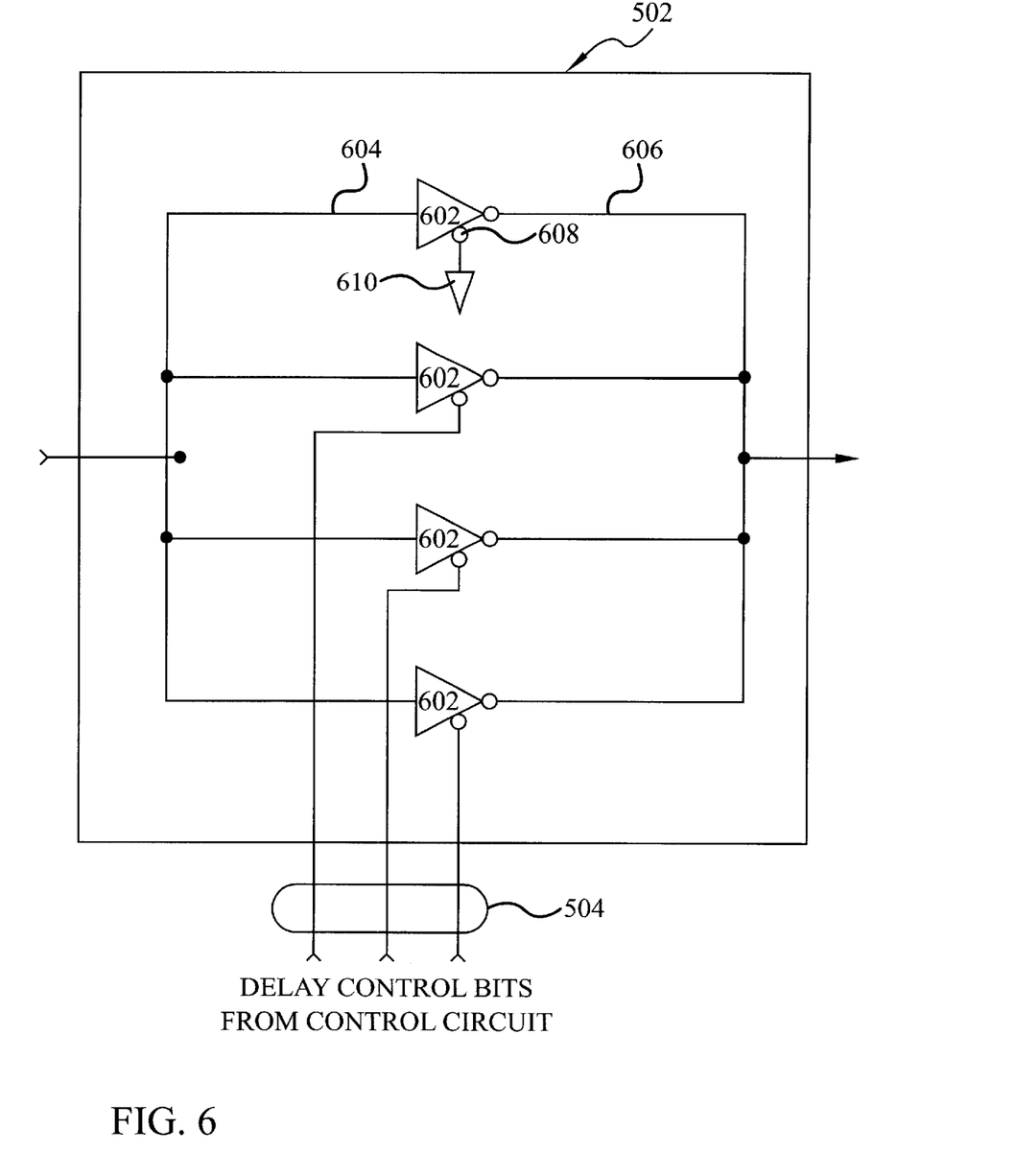
FIG. 6 is a functional schematic diagram of an embodiment of a portion of the variable frequency oscillator depicted in FIG. 5.

There are numerous ways of implementing the variable delay cell 502 functionality. However, a preferred embodiment for implementing this function is depicted explicitly in FIG. 6. In this preferred embodiment, the variable delay cell 502 comprises a plurality of parallel-connected inverting tristate drivers 602. As is known in the art, inverting tristate drivers 602 include at least an input line 604, an output line 606, and an enable line 608. In order to keep the second oscillator 106 running, one of the inverting tristate drivers 602 in each variable delay cell 502 must always be enabled. To accomplish this, one of the enable lines 608 must be connected to a potential that causes the particular inverting tristate driver 602 to remain enabled. Thus, in the particular preferred embodiment depicted in FIG. 6, in which the enable line 608 includes an inverter, the enable line 608 is connected to a ground potential 610. The remainder of the inverting tristate drivers 602, each have their enable lines 608 coupled to receive the delay control bits from the control circuit's plurality of parallel output lines 322 (422).

Figure 7:
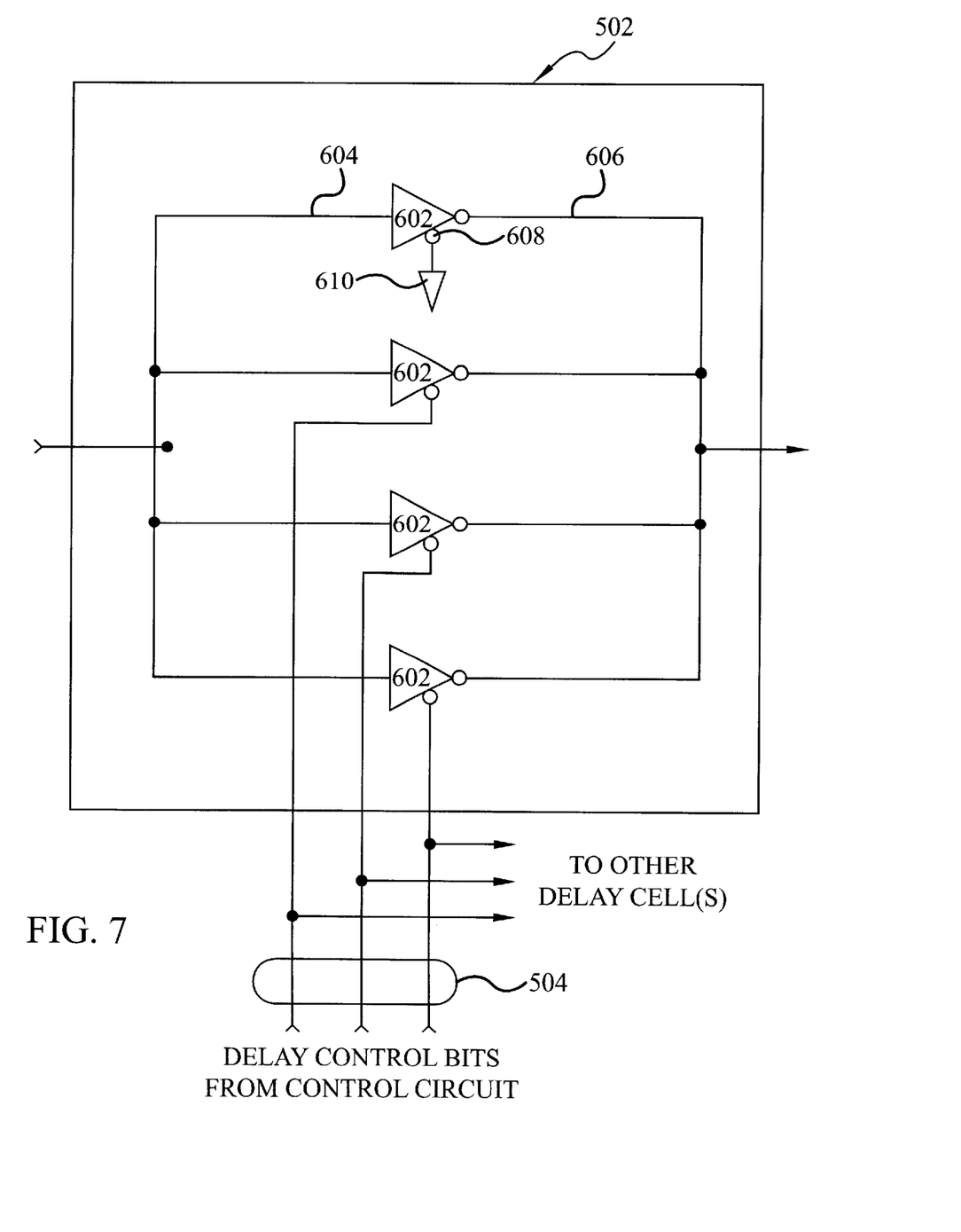
FIG. 7 is a functional schematic diagram of another embodiment of a portion of the variable frequency oscillator depicted in FIG. 5.

The preferred variable delay cell 502 embodiment described immediately above depicts each enable line 608, with the exception of the one coupled to the ground potential 610, individually coupled to a single one of the plurality of parallel output lines 322 (422). Alternatively, as depicted in FIG. 7, the parallel output lines 322 (422) may be individually coupled to more than one enable line 608 in different delay cells 502. Moreover, although described and depicted as comprising four inverting tristate drivers 602, various numbers of drivers 602 may be selected to implement an individual variable delay cell 502.

Operation of the circuit 100 can best be understood by viewing the waveforms depicted in FIG. 8. These waveforms are merely exemplary of those that may be generated by a preferred embodiment of the present invention. With reference now to FIG. 8, the depicted exemplary waveforms are those at the output of the first oscillator 102, which is labeled 802, and at the output of the second oscillator 106, which is labeled 804. As illustrated, the frequency of the first oscillator 102 is substantially fixed, and is less than that of the second oscillator 106. Additionally, with the control circuits 104 depicted in FIGS. 3 and 4, the frequency of the second oscillator 108 can be seen to randomly vary with each cycle of the first oscillator 102. That is, with each rising edge of first oscillator output waveform 802 the signal input to the control circuit 104 changes, which results in the frequency of the second oscillator output waveform 804 varying in response thereto. It will be appreciated that the present invention is not constrained to that which results in frequency variation on only the rising edge of the first oscillator 102. Indeed, the skilled artisan will appreciate that the present invention encompasses the variation occurring on the falling edge of the first oscillator 102, or both the rising and falling edges of the first oscillator 102.

It is noted that the magnitude frequency difference between the first oscillator 102 and the second oscillator 106 is selected to meet the particular design requirements of the system into which the circuit 100 may be placed. The only constraint being that the frequency of the first oscillator 102 is sufficiently less than that of the second oscillator 106 so that the first oscillator 102 will have an effect on the variation of the second oscillator frequency. The particular magnitude difference chosen will depend on the amount, and how fast, it is desired that the first oscillator 102 affect the frequency of the second oscillator 106. Although the waveforms depicted in FIG. 8 are square waves, it will be appreciated that the invention encompasses other waveforms that can be generated by the circuit components that comprise the overall circuit 100.

It will further be appreciated that the present invention may be used as either a stand-alone system, or may be incorporated as part of another system. Additionally, the system architecture disclosed herein is independent of the specific technology used to implement the various circuits that comprise the system, all of which may be found in standard cell libraries. Moreover, the individual circuit components may be included on a single integrated circuit chip, or realized using discrete integrated circuits, or using individual circuit components.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

I claim:

1. An astable oscillator circuit for generating a clock signal having a variable frequency magnitude, comprising:
   a first oscillator generating a first signal having a substantially fixed-frequency magnitude;
   a control circuit coupled to receive the first signal from the first oscillator and output control signals based at least partially on the received first signal; and
   a second oscillator coupled to receive the control signals from the control circuit and generate the variable frequency magnitude clock signal in response to the received control signal.

2. The astable oscillator circuit of claim 1, wherein said control circuit receives the first signal on a serial input line and outputs the control signals as a plurality of control bits on a plurality of parallel output lines.

3. The astable oscillator circuit of claim 2, wherein said control circuit comprises a shift register.

4. The astable oscillator circuit of claim 3, wherein said shift register is a linear feedback shift register.

5. The astable oscillator circuit of claim 3, wherein said shift register comprises an inverter coupled between an input port and an output port of said shift register.

6. The astable oscillator circuit of claim 2, wherein said second oscillator comprises an odd number of variable delay circuits serially coupled one to another in a ring configuration.

7. The astable oscillator circuit of claim 6, wherein each of said variable delay circuits comprises a plurality of inverting tristate drivers electrically connected in parallel with one another.

8. The astable oscillator circuit of claim 7, wherein:
   each of said plurality of inverting tristate drivers that comprise a variable delay circuit includes at least an input line, an output line, and an enable line; and
   at least one of said inverting tristate drivers has its enable line coupled to a potential that causes it to remain enabled, and a remainder of said inverting tristate drivers have their enable lines coupled to said plurality of parallel output lines.

9. The astable oscillator circuit of claim 8, wherein each of said plurality of parallel output lines is individually coupled to a single one of the remainder of said inverting tristate driver enable lines.

10. The astable oscillator circuit of claim 8, wherein each of said plurality of parallel output lines is individually coupled to one or more of the remainder of said inverting tristate driver enable lines.

11. The astable oscillator circuit of claim 1, wherein the substantially fixed-frequency magnitude is less than the variable frequency magnitude.

12. The astable oscillator circuit of claim 1, wherein the first oscillator comprises a free-running ring oscillator.

13. A method of generating a clock signal having a variable frequency magnitude, comprising:
   generating a first signal having a substantially fixed-frequency magnitude;
   generating control signals based at least partially on the first signal; and
   generating the variable frequency magnitude clock signal in response to the control signals.

14. The method of claim 13, wherein the step of generating the control signals comprises receiving the first signal on a serial input of a control circuit and outputting the control signals as a plurality of control bits on a plurality of parallel output lines.

15. The method of claim 14, wherein the plurality of control bits are generated substantially arbitrarily.

16. The method of claim 13, wherein the step of generating the variable frequency magnitude clock signal comprises arbitrarily and selectively varying a delay of each of a plurality of first individual circuit elements that, in combination, generate the variable frequency magnitude signal.

17. The method of claim 16, wherein the step of arbitrarily and selectively varying the delay of first individual circuit elements comprises arbitrarily and selectively enabling a plurality of second circuit elements that comprise each of the first individual circuit elements.

18. The method of claim 13, wherein the substantially fixed-frequency magnitude is less than the variable frequency magnitude.

19. An astable oscillator circuit for generating a clock signal having a variable frequency magnitude, comprising:
   a first oscillator generating a first signal having a substantially fixed-frequency magnitude;
   a shift register coupled to receive the first signal on a serial input line and output a plurality of control bits on a plurality of parallel output lines based at least partially on the received first signal; and
   a plurality of variable delay circuits serially coupled one to another in a ring configuration and coupled to receive the control bits and generate the variable frequency magnitude clock signal in response to the received control bits.

20. The astable oscillator circuit of claim 19, wherein said shift register is a linear feedback shift register.

21. The astable oscillator circuit of claim 19, wherein said shift register comprises an inverter coupled between an input port and an output port of said shift register.

22. The astable oscillator circuit of claim 19, wherein each of said plurality of variable delay circuits comprises a plurality of inverting tristate drivers electrically connected in parallel with one another.

23. The astable oscillator circuit of claim 22, wherein:
   each of said plurality of inverting tristate drivers that comprise a variable delay circuit includes at least an input line, an output line, and an enable line; and
   at least one of said inverting tristate drivers has its enable line coupled to a potential that causes it to remain enabled, and a remainder of said inverting tristate drivers have their enable lines coupled to said plurality of parallel output lines.

24. The astable oscillator circuit of claim 23, wherein each of said plurality of parallel output lines is individually coupled to a single one of the remainder of said inverting tristate driver enable lines.

25. The astable oscillator circuit of claim 23, wherein each of said plurality of parallel output lines is individually coupled to one or more of the remainder of said inverting tristate driver enable lines.

26. The astable oscillator circuit of claim 19, wherein the substantially fixed-frequency magnitude is less than the variable frequency magnitude.

27. The astable oscillator circuit of claim 19, wherein the first oscillator comprises a free-running ring oscillator.

28. A method of generating a clock signal having a variable frequency magnitude, comprising:

generating a first signal having a substantially fixed-frequency magnitude;

receiving the first signal on a serial input of a control circuit and outputting a plurality of control bits on a plurality of parallel output lines based at least partially on the first signal; and arbitrarily and selectively varying a delay of each of a plurality of first individual circuit elements that, in combination, generate the variable frequency magnitude signal, in response to the control bits.

29. The method of claim 28, wherein the plurality of control bits are generated substantially arbitrarily.

30. The method of claim 28, wherein the step of arbitrarily and selectively varying the delay of first individual circuit elements comprises arbitrarily and selectively enabling a plurality of second circuit elements that comprise each of the first individual circuit elements.

31. The method of claim 28, wherein the substantially fixed-frequency magnitude is less than the variable frequency magnitude.

32. An astable oscillator circuit for generating a clock signal having a variable frequency magnitude, comprising:

a free-running ring oscillator generating a first signal having a substantially fixed-frequency magnitude that is less than the variable frequency magnitude;

a linear feedback shift register coupled to receive the first signal on a serial input line and output a plurality of control bits on a plurality of parallel output lines based at least partially on the received first signal; and a plurality of variable delay circuits serially coupled one to another in a ring configuration and coupled to receive the control bits and generate the variable frequency magnitude clock signal in response to the received control bits, each of said plurality of variable delay circuits comprising:

a plurality of inverting tristate drivers electrically connected in parallel with one another, and each including at least an input line, an output line, and an enable line, wherein at least one of said inverting tristate drivers has its enable line coupled to a potential that causes it to remain enabled, and a remainder of said inverting tristate drivers have their enable lines coupled to said plurality of parallel output lines.

33. A method of generating a clock signal having a variable frequency magnitude, comprising:

generating a first signal having a substantially fixed-frequency magnitude that is less than the variable frequency magnitude;

receiving the first signal on a serial input of a control circuit and outputting a plurality of substantially arbitrarily generated control bits on a plurality of parallel output lines based at least partially on the first signal; and arbitrarily and selectively varying a delay of each of a plurality of individual circuit elements that, in combination, generate the variable frequency magnitude signal in response to the control bits, by arbitrarily and selectively enabling parallel connected tristate drivers that comprise each of the individual circuit elements.

34. An astable oscillator circuit for generating a clock signal having a variable frequency magnitude, comprising:

fixed-frequency oscillation means for generating a substantially fixed-frequency magnitude signal;

control means for (i) receiving the substantially fixed-frequency magnitude signal and (ii) generating control signals based at least in part on the substantially fixed-frequency magnitude signal; and variable frequency oscillation means for (i) receiving the control signals and (ii) generating the variable frequency magnitude clock signal in response to the received control signals.

35. The astable oscillator circuit of claim 34, wherein said control means generates the control signals as a plurality of control bits.

36. The astable oscillator circuit of claim 35, wherein said control means generates the plurality of control bits substantially arbitrarily.

37. The astable oscillator circuit of claim 35, wherein said variable frequency oscillation means comprises an odd number of variable delay circuit means for varying a delay time of a signal in response to a received control bit.

38. The astable oscillator circuit of claim 34, wherein the substantially fixed-frequency magnitude is less than the variable frequency magnitude.

* * * * *